(12) United States Patent
Gupta et al.

(10) Patent No.: US 6,747,294 B1
(45) Date of Patent: Jun. 8, 2004

(54) GUARD RING STRUCTURE FOR REDUCING CROSSTALK AND LATCH-UP IN INTEGRATED CIRCUITS

(75) Inventors: Sandhya Gupta, Bloomington, MN (US); Steve L. Kosier, Lakeville, MN (US); John C. Beckman, Minneapolis, MN (US)

(73) Assignee: PolarFab LLC, Bloomington, MN (US)

( * ) Notice: Subject to any disclaimer, the term of this patent is extended or adjusted under 35 U.S.C. 154(b) by 0 days.

(21) Appl. No.: 10/255,561

(22) Filed: Sep. 25, 2002

(51) Int. Cl.[7] ............................................. H01L 29/423
(52) U.S. Cl. ..................... 257/127; 257/409; 257/484; 257/605
(58) Field of Search ................... 257/127, 409, 257/484, 605

(56) References Cited

U.S. PATENT DOCUMENTS

| | | | |
|---|---|---|---|
| 4,466,011 A | | 8/1984 | Zanten .......................... 357/48 |
| 4,567,502 A | * | 1/1986 | Nakagawa et al. .......... 257/490 |
| 4,647,957 A | | 3/1987 | Coquin et al. ................. 357/42 |
| 4,656,730 A | | 4/1987 | Lynch et al. .................... 29/571 |
| 5,023,689 A | * | 6/1991 | Sugawara ...................... 257/372 |
| 5,413,944 A | | 5/1995 | Lee ................................ 437/34 |
| 5,485,027 A | | 1/1996 | Williams et al. ............. 257/343 |
| 5,565,701 A | | 10/1996 | Zambrano .................... 257/500 |
| 5,679,587 A | | 10/1997 | Zambrano ..................... 437/32 |
| 5,994,754 A | * | 11/1999 | Hayashi et al. ............... 257/495 |
| 6,157,070 A | | 12/2000 | Lin et al. ..................... 257/392 |
| 6,229,185 B1 | | 5/2001 | Chen ........................... 257/372 |
| 6,255,710 B1 | | 7/2001 | Weitzel et al. .............. 257/501 |
| 6,555,884 B1 | * | 4/2003 | Murakami ................... 257/409 |

OTHER PUBLICATIONS

Chow et al., Interaction Between Monolithic, Junction-Isolated Lateral Insulated-Gate Bipolar Transistors, Feb. 1991, pp. 310–315.
Bafleur et al., Application of a Floating Well Concept to a Latch-up-Free, Low-Cost, Smart Power High-Side Switch Technology, Jul., 1993, pp. 1340–1342.
Chen et al, An Effective Cross-Talk Isolation Structur for Power IC Applications, 1995, 38.4.1–38.4.4.
Andreini et al., Smart Power ICs, Technologies and Applications, 1996, 174–223.

* cited by examiner

Primary Examiner—Allan R. Wilson
(74) Attorney, Agent, or Firm—Kinney & Lange, P.A.

(57) ABSTRACT

An integrated circuit having very low parasitic current gain includes a guard ring that is used to completely surround a device, such as a power device, that induces parasitic current. The guard ring is formed in a semiconductor body layer such as an epitaxial layer and has a central guard ring of the same type conductivity as that of the body layer and additional flanking rings of the opposite type conductivity. An unbiased configuration of the guard ring based on the above structure is particularly effective in reducing the parasitic gain. The effectiveness of the guard ring, such as the high current performance, is further improved by reducing the resistance between neighboring rings using various methods.

36 Claims, 9 Drawing Sheets

GUARD RING STRUCTURE FOR REDUCING CROSSTALK AND LATCH-UP IN INTEGRATED CIRCUITS

BACKGROUND OF THE INVENTION

The present invention generally relates to semiconductor integrated circuit technology. More particularly, the present invention relates to an integrated circuit for reducing crosstalk and latch-up susceptibility.

In an integrated circuit (IC) having multiple devices monolithically built on the same substrate, unintended parasitic devices such as transistors, diodes or resistors are difficult to avoid and these parasitic devices cause undesirable crosstalk between devices. In a CMOS based integrated circuit using a p-substrate, for example, an n-well, the p-substrate, and another n region form a parasitic NPN transistor that could be turned on when one of the PN junctions in the transistor is forward-biased, thus causing latch-up of a device on the integrated circuit or even permanently damaging the integrated circuit. Latch-up is a condition in which a circuit draws uncontrolled amounts of current, and certain voltages are forced, or "latched-up," to some undesirable and uncontrollable level that violates the operating conditions of the circuit. Latch-up conditions are most often caused by crosstalk between devices in an integrated circuit. Undesirable crosstalk between devices exists in bipolar integrated circuits, as well as field effect transistors such as a MOSFET.

The crosstalk and the related latch-up problem is particularly serious in smart power ICs. A smart power IC, or integrated power circuit, combines one or more power devices (such as high-voltage, high-powered transistors) with control circuits (such as low-voltage, low-power transistors) on the same chip. The smart power IC is fabricated monolithically, thus offering better performance, reduced cost, and increased reliability. Unfortunately, the above integration poses a threat of latch-up due to, for example, injection of minority carriers into the substrate caused by a forward-biased junction between a n-tub of a high-power device and the substrate. Such forward biasing conditions are often created by transient voltages induced during switching of the power device. One of the most important issues in smart power ICs is device interaction between devices. Such device interaction may occur between power devices, as well as between power devices and low voltage devices such as control devices. Wider and more efficient utilization of smart power IC technology will require a satisfactory technique to prevent such crosstalk that causes latch-up.

Various techniques exist in the art to reduce inter-device crosstalk. U.S. Pat. No. 4,466,011 to Zanten, for example, discloses an isolation structure in a bipolar integrated circuit to prevent leakage current from one component to another. In the bipolar integrated circuit of the above patent, elementary components are formed in islands of an N-type epitaxial layer surrounded by P-type isolation walls. The protection against leakage current is obtained by surrounding an island susceptible to receive negative voltage surges with an annular island of the same N-type epitaxial layer.

In smart power IC designs, attempts have also been made to improve isolation between devices. The proposed solutions include using a high resistivity substrate, or adding a series gate resistance to the gate driver circuitry (T. P. Chow et al., "Interaction between monolithic, junction isolated G lateral insulated-gate bipolar transistors," *IEEE Trans. Electron Devices*, Vol. 38, No. 2, pp. 310–315, 1991); using a floating well design (M. Bafleur, et al., "Application of a floating well concept to a latch-up free, low-cost, smart power high-side switch technology," *IEEE Trans Electron Devices*, Vol. 40, No. 7, pp. 1340–1342, 1993); introducing a high resistance layer on a portion of the upper surface of the substrate, either directly overlaying or adjacent to the power device (U.S. Pat. No. 6,255,710 to Weitzel et al.); and isolating the power device that induces latch-up with guard rings (W. Chan, et al., "An effective crosstalk isolation structure for power IC applications," *IEDM Tech. Dig.* 1995, pp. 971–974, and D. Rossi, "Power MOSFETs driving circuits and protection techniques," in Smart Power ICs: Technologies and Applications, B. Murari et al., Eds, New York: Springer-Verlag, 1996, pp. 173–223).

Although the above attempts help alleviate the latch-up problem in smart power ICs, alternative methods and improvements are still necessary in smart power ICs particularly, chip designs and fabrication methods preferred or mandated by certain considerations such as performance and costs may be subject to induced minority carrier injections at much higher levels than those found in the CMOS structures shown in references such as the aforementioned article by W. Chan, et al. In addition, both biased and unbiased guard rings which surround the high-voltage device should be explored for better prevention of latch-up by reducing the gain of the parasitic substrate NPN that injects minority carriers into the substrate. References such as W. Chan, et al. indicated that biased rings in structures therein significantly outperform unbiased rings in terms of the effectiveness of the isolation. However, unbiased rings may be preferable because they avoid power consumption and interconnect requirements of biased guard rings. It is therefore particularly necessary to design an improved unbiased guard ring structure to prevent latch-up in smart power ICs.

BRIEF SUMMARY OF THE INVENTION

The present invention is an integrated circuit having very low parasitic current gain. The integrated circuit is built on a monolithic semiconductor body material, and comprises a semiconductor epitaxial layer of a first type conductivity grown on a semiconductor substrate, a semiconductor device formed in the epitaxial layer, and a semiconductor central guard ring formed in the epitaxial layer. The central guard ring has a second type conductivity opposite to the first type conductivity and surrounds the semiconductor device. The integrated circuit further includes two flanking rings formed in the epitaxial layer. The two flanking rings have a lower resistivity than the epitaxial layer. The first flanking ring is disposed between the semiconductor device and the central guard ring, while the second flanking ring is disposed outside of the central guard ring. The two flanking rings thus "sandwich" the central guard ring.

In one embodiment, the epitaxial layer and the substrate have the same type conductivity. The central guard ring, which has the opposite type conductivity, acts as a collector of minority carriers in the substrate, while the two flanking rings act as an isolator and a supplier for majority carriers, respectively. In another embodiment, the central guard ring is unbiased, the first flanking ring is grounded, and the central guard ring and the second flanking ring are shorted together. In one particular embodiment, the central guard ring is wider than any of the first and second flanking rings. These embodiments maximize the effectiveness of the guard ring structure in accordance with the present invention from different aspects.

In a further embodiment of the invention, the integrated circuit comprises a semiconductor body layer having a first type conductivity, a semiconductor device formed in the body layer, a semiconductor central guard ring formed in the body layer, and two flanking rings that are formed in the body layer but have a lower resistivity than the body layer. The central guard ring and two flanking rings surround the device. The first flanking ring is disposed between the semiconductor device and the central guard ring, and the second flanking ring is disposed outside of the central guard ring. The integrated circuit further includes means for reducing resistance across a region that is located between the first and second flanking rings. The introduction of the means for reducing resistance increases the high current performance of the guard ring structure in accordance with the present invention.

DETAILED DESCRIPTION

Figure 1:
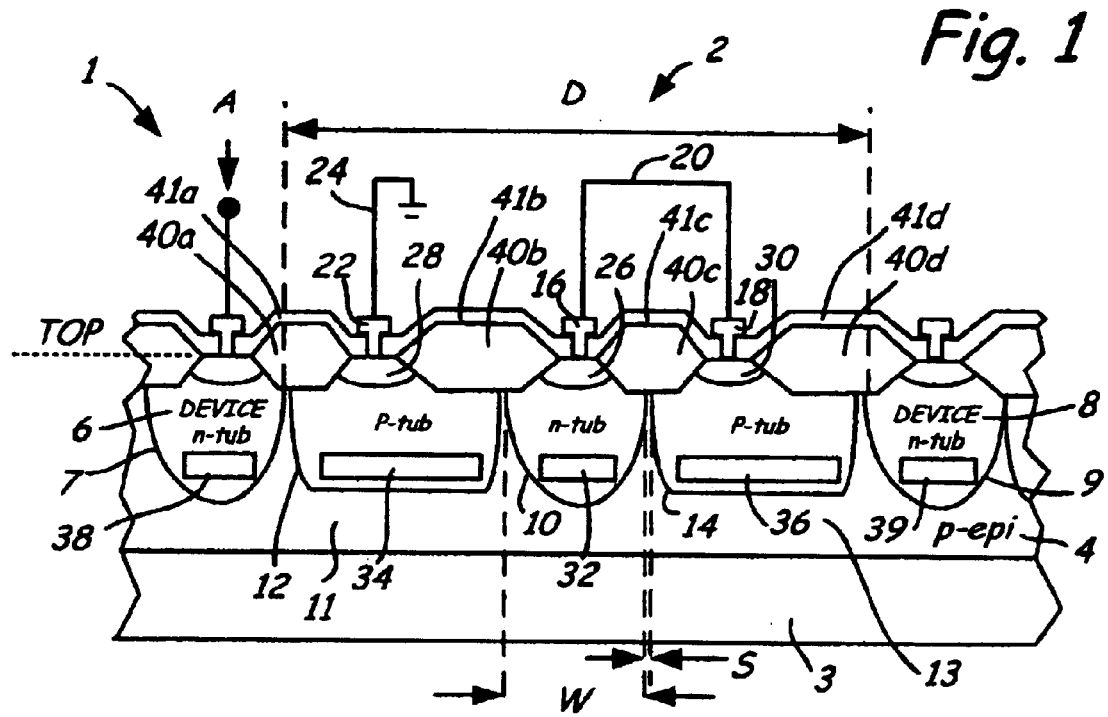
FIG. 1 is a cross-section of a portion of an integrated circuit having a guard ring built on a P-type semiconductor substrate in accordance with the present invention.

The present invention is a novel guard ring structure that can be used to isolate a variety of semiconductor devices. Both high-voltage power device and low-voltage control circuit can be prone to inducing parasitic current. The devices that are most likely to produce parasitic current are those connected to bond pads, especially if these devices are driving an external inductor. Although the invention is illustrated using a high-voltage power device, the guard ring can be used to isolate either a high-voltage power device or a low-voltage control circuit. The guard ring can be used either to isolate a device that causes parasitic current (i.e., acting as an emitter of a parasitic junction transistor) or to isolate a device that is particularly susceptible to the influence of parasitic current caused by a nearby device (i.e., acting as a collector of a parasitic junction transistor), although it is typically more effective to do the former because a single inducing device may affect several other devices. The guard ring may be deployed in a lateral direction to reduce lateral parasitic current, or deployed in a vertical direction to reduce vertical parasitic current. Illustrations in the present description, however, assume lateral deployment, which is the most probable case when the guard ring is used to surround a laterally diffused MOS (LDMOS) power device.

In the present description, the term "lateral" indicates a direction generally in or substantially parallel to the conventional semiconductor wafer plane. The term "vertical" indicates a direction in the conventional semiconductor wafer depth direction.

In addition, the guard ring may be scalable. That is, the "device" that is to be isolated by the guard ring may be a single device such as a transistor, but may also be a group of several devices located in a distinctive region in an integrated circuit.

The present invention will be described below with references to particular exemplary embodiments. In these embodiments, the guard ring is shown to isolate a single high-voltage power device that causes lateral parasitic current in the substrate or a semiconductor body layer. A substrate may be any material used in a semiconductor fabrication process as a starting or base material on which other components are formed. A body layer is a semiconductor layer in or on which semiconductor components and devices are formed. However, as indicated above, the application of the guard ring according to the present invention is not limited to the particular configurations shown in the exemplary embodiments. In addition, although the terms "substrate" and "body layer" are used in specific embodiments to describe different parts of an integrated circuit, this usage does not suggest any general and inherent difference between a body layer and a substrate. For example, a body layer may only be a part of the substrate, defined not by a physical separation of two different materials but by a particular location in the substrate.

An exemplary integrated circuit in accordance with the present invention is explained below with reference to FIGS. 1 and 2.

FIG. 1 is a cross-section of a portion of integrated circuit 1 including guard ring 2. Integrated circuit 1 is built on P-type semiconductor substrate 3. Semiconductor body layer 4, shown as a P-type epitaxial body layer 4 in FIG. 1, is disposed on substrate 3. Two semiconductor devices 6 and 8 are formed in body layer 4. Body layer 4 has a top surface TOP. Semiconductor devices 6 and 8 are built close to top surface TOP of body layer 4.

To decrease or avoid crosstalk between devices 6 and 8 induced by device 6, N-type central guard ring 10 is formed between devices 6 and 8. Central guard ring 10 surrounds device 6 and is laterally spaced from device 6 by flanking region 11 of body layer 4. Central guard ring 10 is further surrounded by flanking region 13 of body layer 4. First P-type flanking ring 12 is formed in region 11 of body layer 4. Second P-type flanking ring 14 is formed in region 13 of body layer 4.

Figure 2:
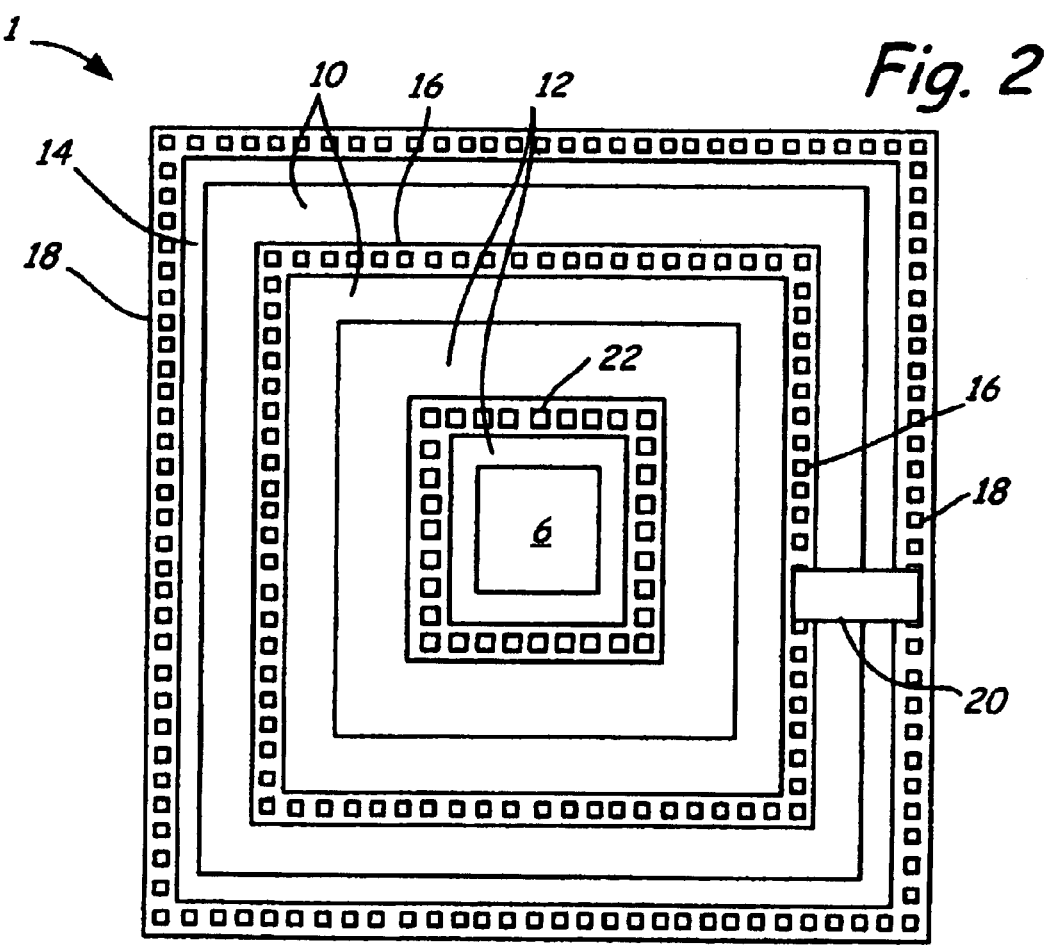
FIG. 2 is a top view of the portion of integrated circuit shown in FIG. 1.

FIG. 2 is a top view of a portion of integrated circuit 1 shown in FIG. 1. The basic guard ring structure 2 in accordance with the present invention has three rings (central guard ring 10 and two flanking rings 12 and 14) formed in body layer 4 (not shown in FIG. 2) and surrounding device 6. Central guard ring 10 and flanking rings 12 and 14 each have an annular shape, disposed substantially parallel to top surface TOP. Central guard ring 10 and flanking rings 12 and 14 are concentric and substantially symmetric with respect to symmetry point A (FIG. 1) on device 6.

In the embodiment shown in FIG. 1, central guard ring 10 is formed by a N-type tub formed in P-type epitaxial body layer 4. Flanking rings 12 and 14 are each formed by a P-type tub formed in P-type epitaxial body layer 4. The detail of forming these N-type and P-type tubs (corresponding to rings 10, 12 and 14, respectively) is described later in this description. To facilitate better conductive connections, N+ implant 26 is placed in central guard ring (N-type tub) 10. Similarly, P+ implants 28 and 30 are placed in flanking rings 12 and 14 (P-type tubs) respectively. To avoid vertical breakthrough, central guard ring 10 further includes in its corresponding N-type tub an N-type buried layer 32. For a similar purpose, flanking rings 12 and 14 include in their corresponding P-type tubs P-type buried layers 34 and 36 respectively. Devices 6 and 8 are formed in N-type tubs 7 and 9 respectively. N-type tubs 7 and 9 each include a respective buried layer 38 and 39. FIG. 1 also shows conventional field oxide areas 40a, 40b, 40c and 40d.

At least in theory, flanking rings 12 and 14 may be formed using the in situ flanking regions 11 and 13 of P-type epitaxial body layer 4 without having to form the respective P-type tubs. However, body layer 4, being preferably an epitaxial layer, usually has a relatively low doping concentration and therefore a conductivity that is unsuitably low for the purpose of effecting flanking rings 12 and 14. This is particularly true for flanking ring 14 which functions as majority carrier supplier. For this reason, flanking rings 12 and 14 are preferably formed by separately formed P-type tubs that have a higher doping concentration than that of body layer 4.

It should be noted that various amount of lateral separation between two adjacent rings, such as the separation between central guard ring 10 and flanking ring 14 denoted as S in FIG. 1, are contemplated by the present invention. In fact, two adjacent rings may be in contact with each other or even overlap each other.

A brief description of an exemplary process of making the structure according to FIG. 1 is given below. The details of the fabrication process are not essential for the concept of the present invention.

P+ doped monocrystalline silicon substrate 3 is first provided as a starting material. In the presently described embodiment, substrate 3 is doped with boron to a bulk resistivity of about 7–20 mΩ-cm. P-type epitaxial body layer 4 is grown on the (100) plane of crystalline substrate 3 to form body layer 4. Body layer 4 is about 15 μm thick and is doped with boron to a bulk resistivity of about 1.45 Ω-cm. Masks (not shown in FIG. 1) for buried layers 32, 34 and 36 are added. Buried layers 32, 34 and 36 are implanted into body layer 4 according to the mask pattern. This implantation is performed using sequential doses arsenic. After removing the masks for buried layers, new masks (not shown in FIG. 1) for N-type tubs 7, 9 and 10 are added. N-type tub 7, 9 and 10 are then implanted according to the mask pattern into body layer 4. This implantation is performed using sequential doses of phosphorous. A diffusion drive is then performed on N-type implants to drive N-type tubs 7, 9 and 10 deep into on body layer 4. After removing the previous masks for N-type tubs, new masks (not shown in FIG. 1) for the respective P-type tubs of ranking rings 12 and 14 are added. The respective P-type tubs of ranking rings 12 and 14 are then implanted into body layer 4 according to the new mask pattern. The implantations for the P type tub of flanking rings 12 and 14 are performed using sequential doses boron.

After the above tub regions have been formed, pad oxides and nitrites (not shown in FIG. 1), field oxides (40a, 40b, 40c and 40d in FIG. 1), and device oxides 41a, 41b, 41c and 41d are formed using conventional techniques including deposition and annealing. Proper ISO masking and etching then creates desired field oxide and nitrite patterns.

Implants 26, 28 and 30 are then formed in central guard ring 10 and flanking rings 12 and 14 respectively. The implantation for N+ type implant 26 is performed using doses of phosphorous followed by doses of arsenic. The implantation for P+ type implants 28 and 30 is performed using doses of phosphorous.

Integrated circuit 1 is then finished using the following additional processes that are familiar in the art: 1) filling and planarization using Tetraethylorthosilicate (TEOS) and Boron-doped Phospho-Silicate Glass (BPSG) deposition; 2) recrystallization and reflow annealing to improve dopant activation; 3) rapid thermal annealing (RTA) to further improve dopant activation; and 4) metallization to form metal contacts 16, 18 and 22.

Although the present invention is not bound by the validity of any theoretical explanation, a general explanation of how guard ring structure 2 works in integrated circuit 1 is given as follows. When device 6, such as a power device, is subject to a low transient voltage, minority carriers (electrons in the structure shown in FIG. 1) may be induced and injected into substrate 3, making the nearby device 8 susceptible to crosstalk latch-up. Integrated circuit 1 in effect has a parasitic NPN (or PNP in a structure with conductivity types reversed) in which an N region in the inducing device 6 acts as emitter, P-type substrate 3 acts as a base, and an N region in the receiving device 8 acts as a collector. The higher the parasitic NPN gain (1c/1b) is, the more susceptible to crosstalk latch-up the integrated circuit 1 is. Guard ring structure 2 (including rings 10, 12 and 14) forms a wall around latch-up inducing device 6 to stop or reduce such minority carriers. In the configuration shown in FIG. 1, central guard ring 10 acts as a minority carrier collector. Flanking ring 14 acts as a majority carrier supplier. Flanking ring 12 acts as an isolator.

One significant advantage of guard ring 2 shown in FIG. 1 is that the guard ring's effectiveness is optimized, rather than compromised as in the guard ring structure disclosed in W. Chan, et al., by configuring it as an unbiased guard ring structure. An unbiased guard ring is preferred because it requires no extra power and associated interconnections. To form an unbiased guard ring structure 2, central guard ring 10 and flanking ring 14 in FIG. 1 are connected together through metal contacts 16 and 18 and low ohmic connector 20, but are unbiased, meaning that they are not connected to any other part of the circuit 1 except for body layer 4 or substrate 3. Low ohmic connector 20 is preferably a metal connector to short central guard ring 10 and flanking ring 14 together. Flanking ring 12 is grounded through metal contact 22 and connector 24. As central guard ring 10 and flanking ring 14 are shorted together, minority carriers combine with majority carriers before they reach the nearby device 8. The unbiased configuration increases the effectiveness of central guard ring 10 as a minority carrier collector and of flanking ring 14 as a majority carrier supplier. The net effect is that the parasitic NPN transistor has more recombination current and less flow-through current. The effectiveness of unbiased guard ring structure 2 is demonstrated below with reference to FIGS. 3–4.

Figure 3:
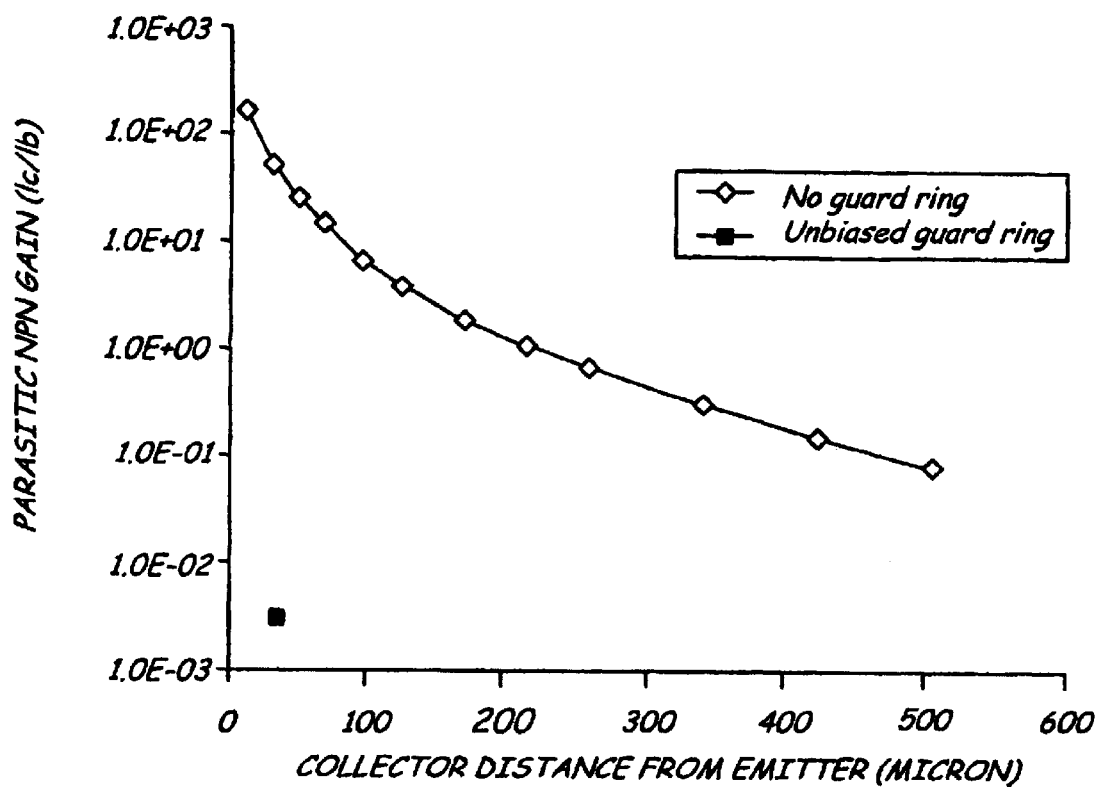
FIG. 3 is a graph showing parasitic NPN gain measured in the integrated circuit of the invention in comparison with parasitic NPN gains measured in integrated circuits that do not have a guard ring.

FIG. 3 is a graph showing parasitic NPN gain (1c/1b) measured in integrated circuit 1 of FIG. 1 having an unbiased guard ring 2 in comparison with parasitic NPN gains (1c/1b) measured in integrated circuits that do not have a guard ring. The integrated circuits without a guard ring (not shown) have the same substrate 3 and the same devices 6 and 8 as that of integrated circuit 1 of FIG. 1 having an unbiased guard ring 2. For both types of integrated circuits, the emitter size is $10.2 \times 10.2\ \mu m^2$. Measurements are done at Vc=20V, Vb=0V, and Ie=30 $\mu A$. The measurements of the integrated circuits without a guard ring are done using various distances D (FIG. 1) between devices 6 and 8. As shown in FIG. 3, the parasitic substrate NPN gain in the integrated circuits without a guard ring is more than 1.0 even when D is as large as 200 $\mu m$ (i.e., when the collecting device 8 is 200 $\mu m$ away from the inducing device 6), making the integrated circuits susceptible to latch-up. When D is 20 $\mu m$, the parasitic substrate NPN gain in the integrated circuits without a guard ring is as high as 51. In contrast, at the same distance (D=20 $\mu m$), using unbiased guard ring 2 in integrated circuit 1 of FIG. 1 reduces the parasitic substrate NPN gain from 51 to 0.003, by more than four orders of magnitude.

Figure 4:
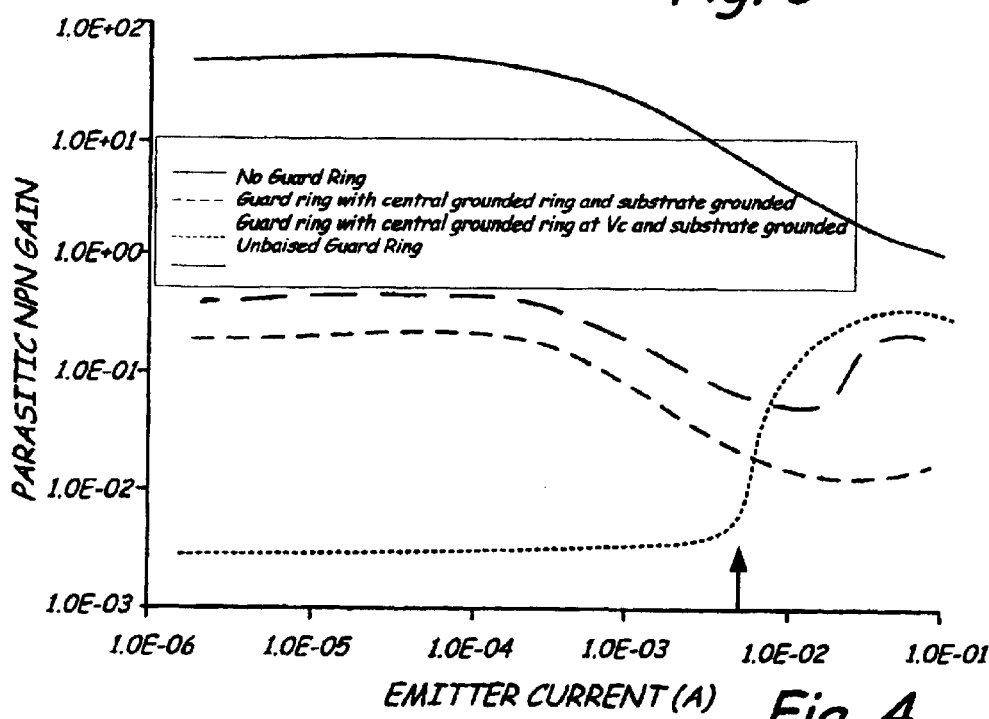
FIG. 4 is a graph showing parasitic NPN gains measured in integrated circuits of various configurations at different emitter current levels.

FIG. 4 is a graph showing parasitic NPN gains (1c/1b) measured in integrated circuits of various configurations, including several using a guard ring in accordance with the present invention, at different emitter current levels. Emitter size is $10.2 \times 10.2\ \mu m^2$. As shown in FIG. 4, compared to the integrated circuit without any guard ring, the integrated circuits using a guard ring in accordance with the present invention all reduce the parasitic gain significantly. At lower emitter current levels (<4 mA), however, unbiased guard ring 2 of FIG. 1 has higher a level of reduction of the parasitic gain than the two biased guard rings. The two biased guard rings used for comparison purposes are similar to the guard ring 2 of FIG. 1 except that one has central guard ring 10 and substrate 3 grounded and the other has central ring 10 connected to a power supply at a voltage Vc and substrate 3 grounded. The two biased guard rings reduce the parasitic NPN gain by similar amounts. As shown in FIG. 4, at lower emitter current levels (<4 mA), unbiased guard ring 2 reduces the parasitic substrate NPN gain by almost two orders of magnitude more than the biased guard rings with central ring 10 either grounded or connected to a power supply.

FIG. 4 also shows that above a transition emitter current of about 4 mA, the parasitic gain of unbiased guard ring 2 of FIG. 1 increases, whereas the parasitic gains of the biased guard rings drop. This high current effect is a limitation of unbiased guard ring 2. It is therefore desirable to further improve unbiased guard ring 2 by increasing the transition emitter current above which the high current effect occurs.

A key to increasing the transition emitter current is to reduce electrical potential differences between central guard ring 10 and adjacent flanking rings 12 and 14 (FIG. 1) and/or electrical potential difference between flanking rings 12 and 14. As shown later in this application, reducing one or more of these electrical potential differences helps to significantly improve high current performance of the guard ring in accordance with the present invention.

The most direct way to reduce the aforementioned potential differences is reducing the resistance between the corresponding pair of points that have the potential differences. Examples of these pairs of points include: 1) a point in central guard ring 10 and a point in flanking ring 12; 2) a point in central guard ring 10 and a point in flanking ring 14; and 3) a point in flanking ring 12 and a point in flanking ring 14. It should become evident to one skilled in the art that various methods are available to reduce the resistance between the corresponding points.

As a general consideration, flanking rings 12 and 14 shown in FIG. 1 are substrate contact rings which contact flanking regions 11 and 13 of body layer 4, respectively. Since the semiconductor materials of flanking rings 12 and 14 have higher conductivity than that of body layer 4, placing flanking rings 12 and 14 in flanking regions 11 and 13 already helps to achieve a relatively lower resistance across regions between flanking rings 12 and 14. As another general consideration, the resistance may be reduced by minimizing lateral separations such as S (FIG. 1) between central guard ring 10 and flanking ring 12 or 14.

In addition to the above general considerations, which take into consideration the conductivity characteristics of the materials and distances between the pairs of points of concern, the resistance can be reduced by providing a low resistance parallel path (or connection) between the pairs of points of concern. Here, the term "low resistance" is a relative term and means that the resistance along the provided path is lower than what the original in situ material would have if the path were not provided in place of the original material.

Embodiments using the aforementioned concept are described below with references to FIGS. 5A, 5B and 6–8. Because the exact locations of the pair of points between which the resistance or potential difference is measured are not critical in the present invention, the discussions will be made with reference to rough "regions" instead of exact "points."

Figure 5A:
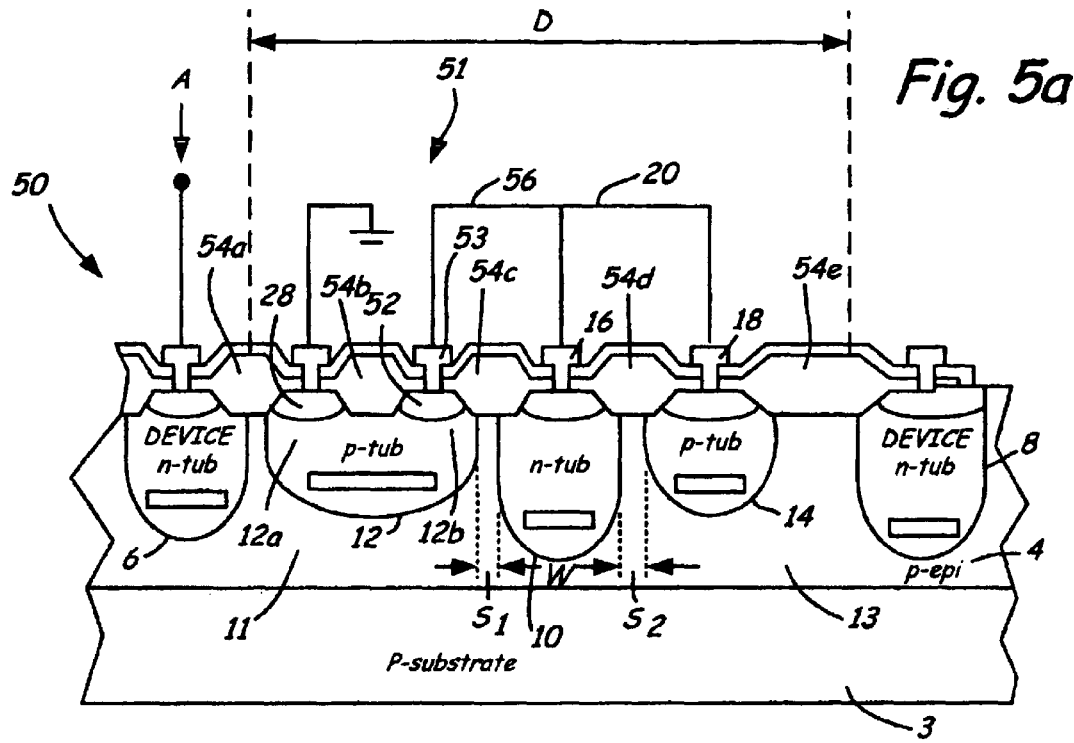
FIG. 5A shows an integrated circuit having a guard ring that uses an exemplary means to reduce the resistance across regions between the two flanking rings.

FIG. 5A shows integrated circuit 50 with guard ring 51 using an exemplary means to reduce the resistance across regions that are disposed between (but not necessarily crossing) flanking rings 12 and 14. In this embodiment, low ohmic connection (wiring) 56, preferably a metal connection, is made between flanking rings 12 and 14 through metal contacts 53 and 18. To facilitate a better conductive connection, P+ implant 52 is placed in flanking ring 12 (P-type tub). Metal contact 53 is connected to P+ implant 52. To avoid central ring 10 and flanking ring 14 being grounded, P+ implant 52 is preferably separated from P+ implant 28 which is connected to the ground. This effectively divides flanking ring 12 into two joined but different rings 12a and 12b which each include a portion of flanking ring 12. In other words, guard ring structure 51 as shown in FIG. 5A effectively has three flanking rings 12a, 12b and 14 in addition to central guard ring 10, wherein flanking rings 12a and 12b are formed by the same shared P-type tub. Alternatively, two smaller P-type tubs (not shown) may be provided separately in place of the same shared P-type tub to form two separate flanking rings 12a and 12b. However, in order to simplify the structure and the fabrication thereof, it is preferred that the single tub for flanking ring 12 is provided to host both flanking rings 12a and 12b as shown in FIG. 5A.

It should be noted that for the purpose of connecting flanking ring 12 (or more specifically flanking ring 12b) with flanking ring 14, it is not necessary that metal contact 53 be connected to the same metal contact 18 that is used with connection 20 to connect central ring 10 and flanking ring 14. Instead, a connection may be made between metal contact 53 and a different contact (not shown) that is on flanking ring 14 but is not the same as metal contact 18. To simplify the structure, however, contact 18 is preferably shared by connection 20 and 56.

Figure 5B:
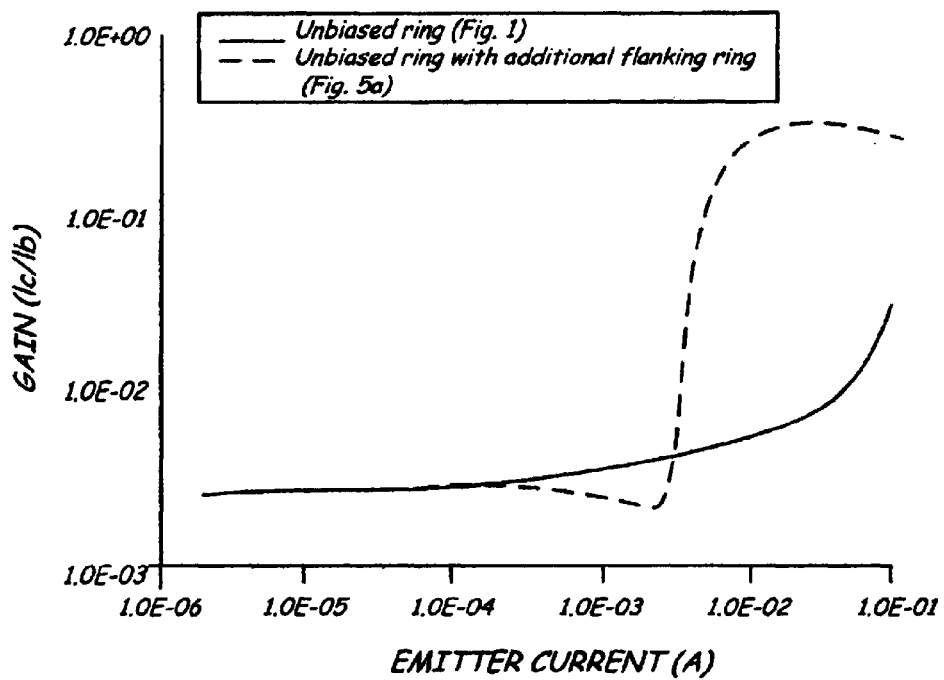
FIG. 5B is a graph showing parasitic NPN gain measured in the integrated circuit of FIG. 5A in comparison with parasitic NPN gain measured in the integrated circuit of FIG. 1.

FIG. 5B is a graph showing parasitic NPN gain (1c/1b) measured in integrated circuit 50 with unbiased guard ring 51 in comparison with parasitic NPN gain (1c/1b) measured in integrated circuit 1 with unbiased guard ring 2. Unbiased guard ring 51 is configured similar to unbiased guard ring 2 except for the additional flanking ring 12b described above to reduce the resistance between flanking rings 12 and 14. As shown in FIG. 5B, at emitter current levels lower than 4.0 mA, unbiased guard ring 2 and unbiased guard ring 51 have similar performances in reducing parasitic NPN gain. As the emitter current reaches a level of about 4.0 mA, the performance of guard ring 2 experiences a transition in which the parasitic gain increases quickly, while the performance of guard ring 51 remains stable and does not experience an apparent transition until about an emitter current level of 50 mA. This indicates that the effective transition current above which high current effect occurs is increased by more than an order of magnitude by adding flanking ring 12b that is conductively connected to central guard ring 10 to reduce the resistance therebetween.

Figure 6:
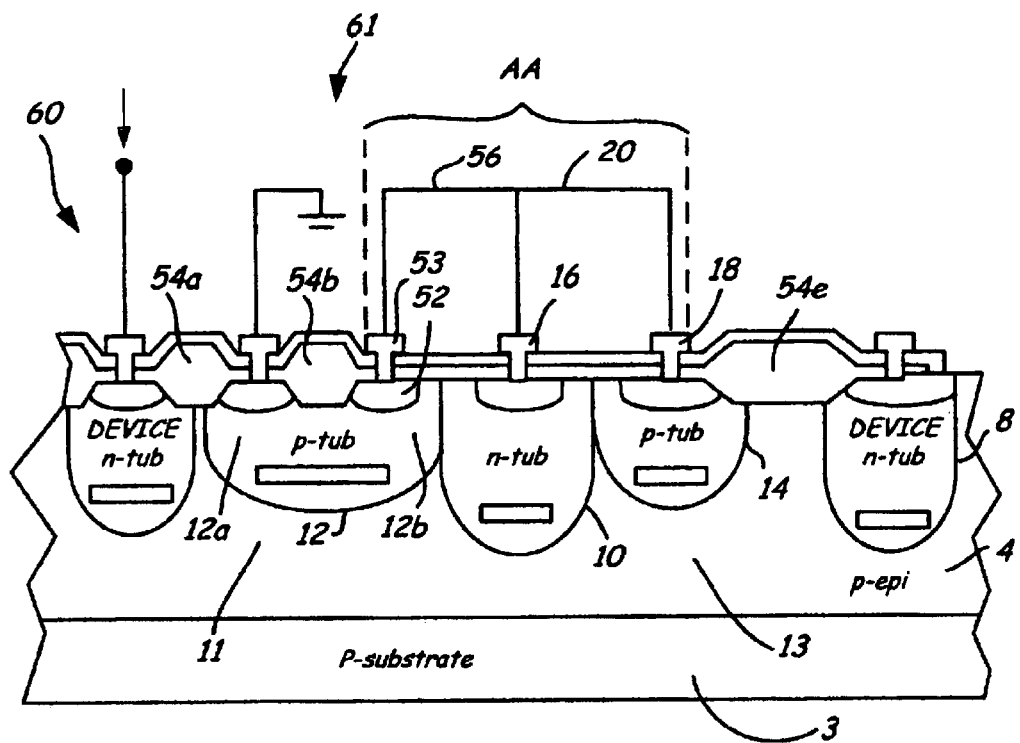
FIG. 6 shows an integrated circuit having a guard ring that uses an alternative means to reduce the resistance across the corresponding regions between the two flanking rings.

FIG. 6 shows integrated circuit 60 with guard ring 61 using an alternative means to reduce the resistance across regions between flanking rings 12 and 14. In this embodiment, central guard ring 10 and flanking guard rings 12b and 14 are placed in the same active area AA. As known in the art, an integrated circuit is divided into active areas by field oxides. Each active area has one or more semiconductor components formed therein. To make active area AA in integrated circuit 60 a single active area, field oxides 54c and 54d in integrated circuit 50 in FIG. 5 are removed. Interconnections 20 and 56 and metal contacts 16, 18 and 53 remain the same in FIG. 6 as in FIG. 5. This configuration helps to reduce resistance between central guard ring 10 and flanking ring 12b, resistance between central guard ring 10 and flanking ring 14, and resistance between flanking rings 12 and 14.

Figure 7:
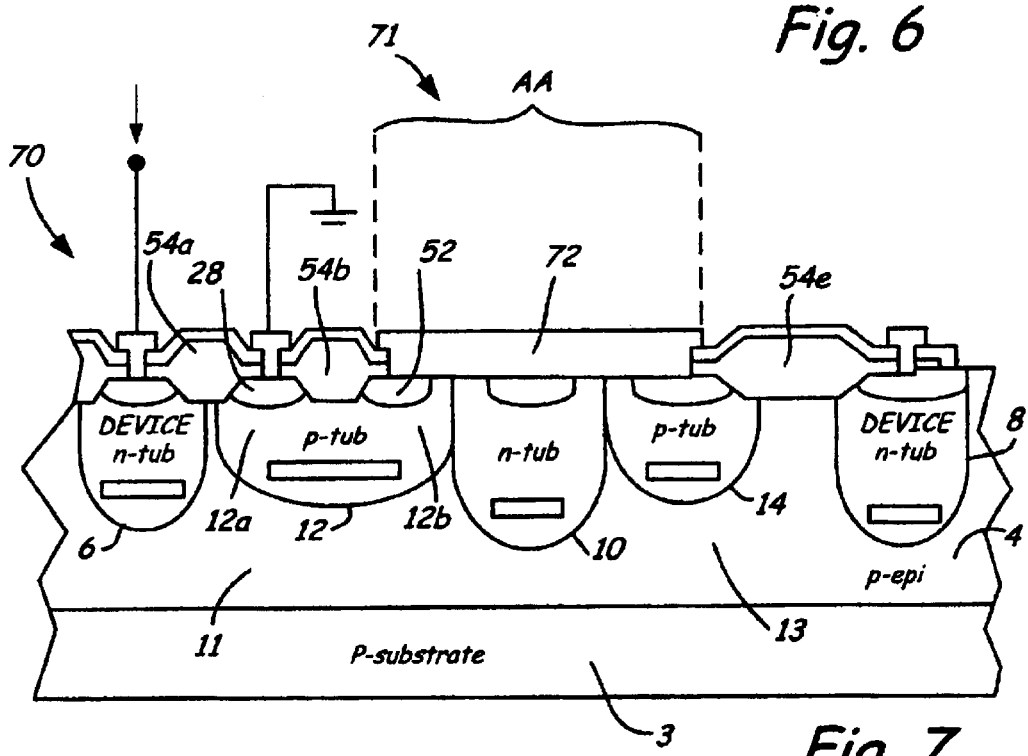
FIG. 7 shows an integrated circuit having a guard ring that uses another alternative means to reduce the resistance across regions between the two flanking rings.

The single active area configuration can be used either in combination with the extra-ring (12b) configuration in FIG. 5 (as shown in FIG. 7), or used separately in the basic three-ring configuration in FIG. 1 (not shown).

FIG. 7 shows integrated circuit 70 with guard ring 71 using another alternative means to reduce the resistance across the corresponding regions between flanking rings 12 and 14. Connecting layer 72 of silicide or salicide is formed over active area AA to join central guard ring 10 to the substrate contacting flanking rings 12b and 14 that surround central guard ring 10. Similar to the guard ring configuration in FIG. 6, this configuration helps to reduce resistance between central guard ring 10 and flanking ring 12b, resistance between central guard ring 10 and flanking ring 14, and resistance between flanking rings 12 and 14.

Figure 8:
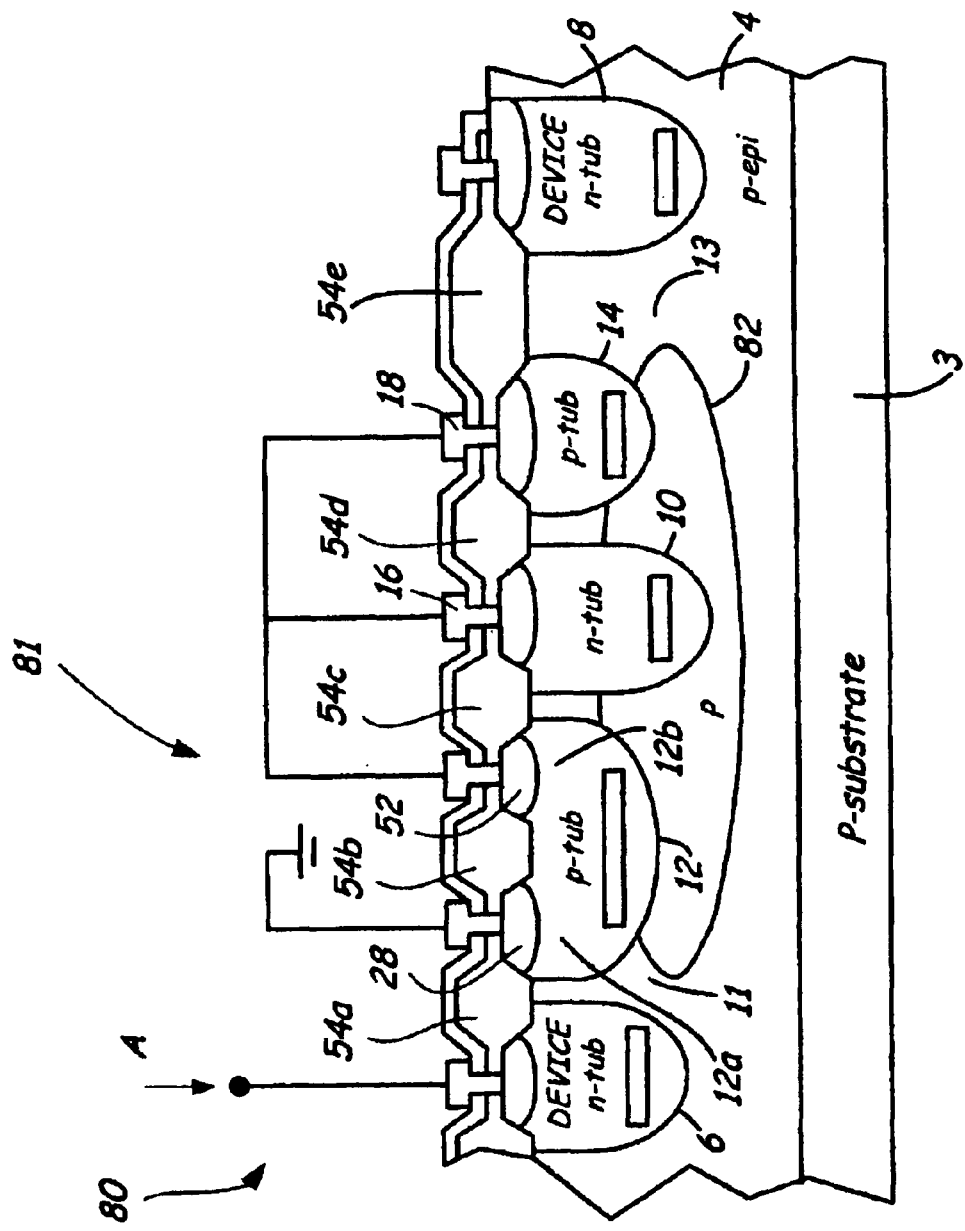
FIG. 8 shows an integrated circuit having a guard ring that uses yet another alternative means to reduce the resistance across regions between the two flanking rings.

Connecting layer 72 can be used either in place of (as shown in FIG. 8) or in addition to (not shown) metal contacts 16, 18 and 53 in FIG. 7. As long as physically compatible, connecting layer 72 can also be used either in combination with the extra-ring (12b) configuration in FIG. 5 (as shown in FIG. 7), or used separately in the basic three-ring configuration in FIG. 1 (not shown).

FIG. 8 shows integrated circuit 80 with guard ring 81 using another alternative means to reduce the resistance across the corresponding regions between flanking rings 12 and 14. Connecting layer 82 (shown as a P-type buried layer) is placed under central guard ring 10 and extends to contact flanking rings 12 and 14. As connecting layer 82 has a higher conductively (i.e., a lower resistivity) than body layer 4, this configuration helps to reduce the resistance between flanking rings 12 and 14. To more effectively reduce the resistance between central guard ring 10 and flanking ring 12 and the resistance between central guard ring 10 and flanking ring 14, connecting layer 82 is preferably in contact with central guard ring 10.

As long as physically compatible, connecting layer 82 can be used 5A in combination of any other guard ring configurations such as guard ring 51 in FIG. (as shown in FIG. 8), guard ring 61 in FIG. 6, guard ring 71 in FIG. 7, or guard ring 2 in FIG. 1 that has the basic three-ring configuration.

Alternatively, a conductor such as a metal trench (not shown), instead of a semiconductor buried layer, may be used as connecting layer 82. Connecting layer 82 is preferably a semiconductor buried layer because it requires relatively simpler fabrication.

Other methods to reduce the resistance across regions between flanking rings 12 and 14 are conceivable. For example, sharing a contact opening for central guard ring 10 and flanking ring 12 and/or 14 helps to a certain degree to reduce the resistance between flanking rings 11 and 13. For another example, at least part of central guard ring 10 and flanking rings 12 and 14 may be formed using a low-resistance poly-filled or metal-filled trench instead of using semiconductor diffusion tubs. The above configuration, although not preferred due to the difficulties of fabrication, can reduce the resistance across the regions between flanking rings 12 and 14, including reduce resistance between central guard ring 10 and flanking ring 12b, resistance between central guard ring 10 and flanking ring 14, and resistance between flanking rings 12 and 14.

In addition, the electrical potential differences between two regions may be reduced without directly reducing the resistance therebetween in a traditional ohmic sense. With reference to FIG. 1, for example, if central guard ring 10 and flanking rings 12 are heavily doped and abut each other, a low-breakdown diode is formed between the two rings (central guard ring 10 and flanking ring 12). The same can be done, either alternatively or additionally, between central guard ring 10 and flanking ring 14. This prevents the potential differences between central guard ring 10 and adjacent flanking ring 12 and 14 from arising beyond a certain level at which the low-breakdown diode experiences a reverse breakdown.

Maximizing the width of central guard ring 10 reduces the gain of the unwanted parasitic transistor. This width can be maximized in a variety of ways, including, but not limited to, combinations of the following: 1) widening central guard ring 10; 2) using multiple central guard rings 10; and 3) using a buried layer that is of the same conductivity type as central guard ring 10, and is electrically connected to central guard ring 10 and laterally extends beyond central guard ring 10 to at least partially underlie flanking ring 12 and/or 14. These methods are explained in detail in the following with reference to FIGS. 9–12.

Figure 9:
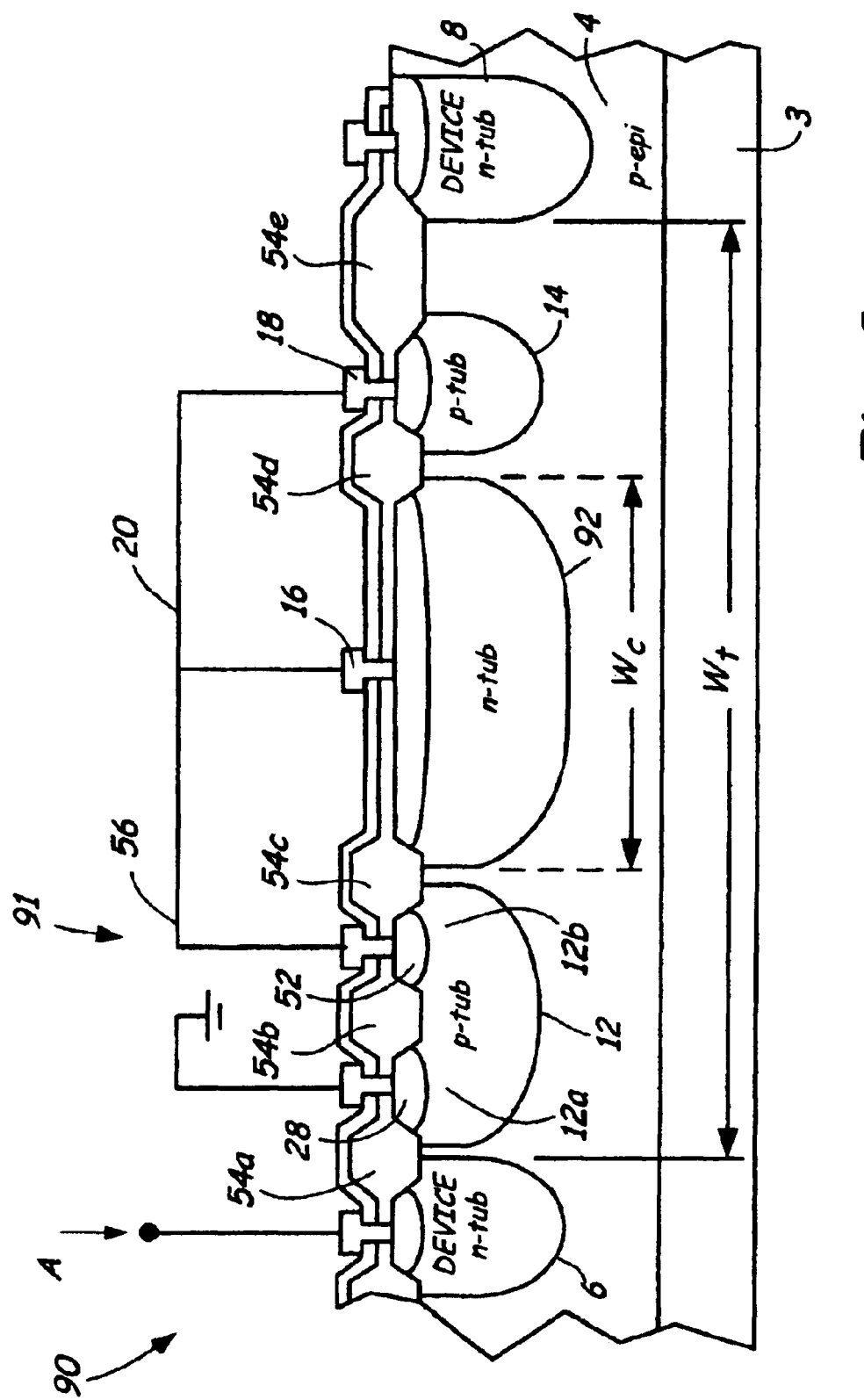
FIG. 9 shows an integrated circuit having a guard ring structure that is similar to the guard ring structure in FIG. 5 but has a much wider central guard ring.

FIG. 9 shows integrated circuit 90 having unbiased guard ring structure 91 that is similar to guard ring structure 51 in FIG. 5A but has a much wider central guard ring 92 as compared to central guard ring 10 in FIG. 5A. The width of central guard ring 92 is denoted as Wc. The overall width of the guard ring 91 is denoted as Wt.

Figure 10:
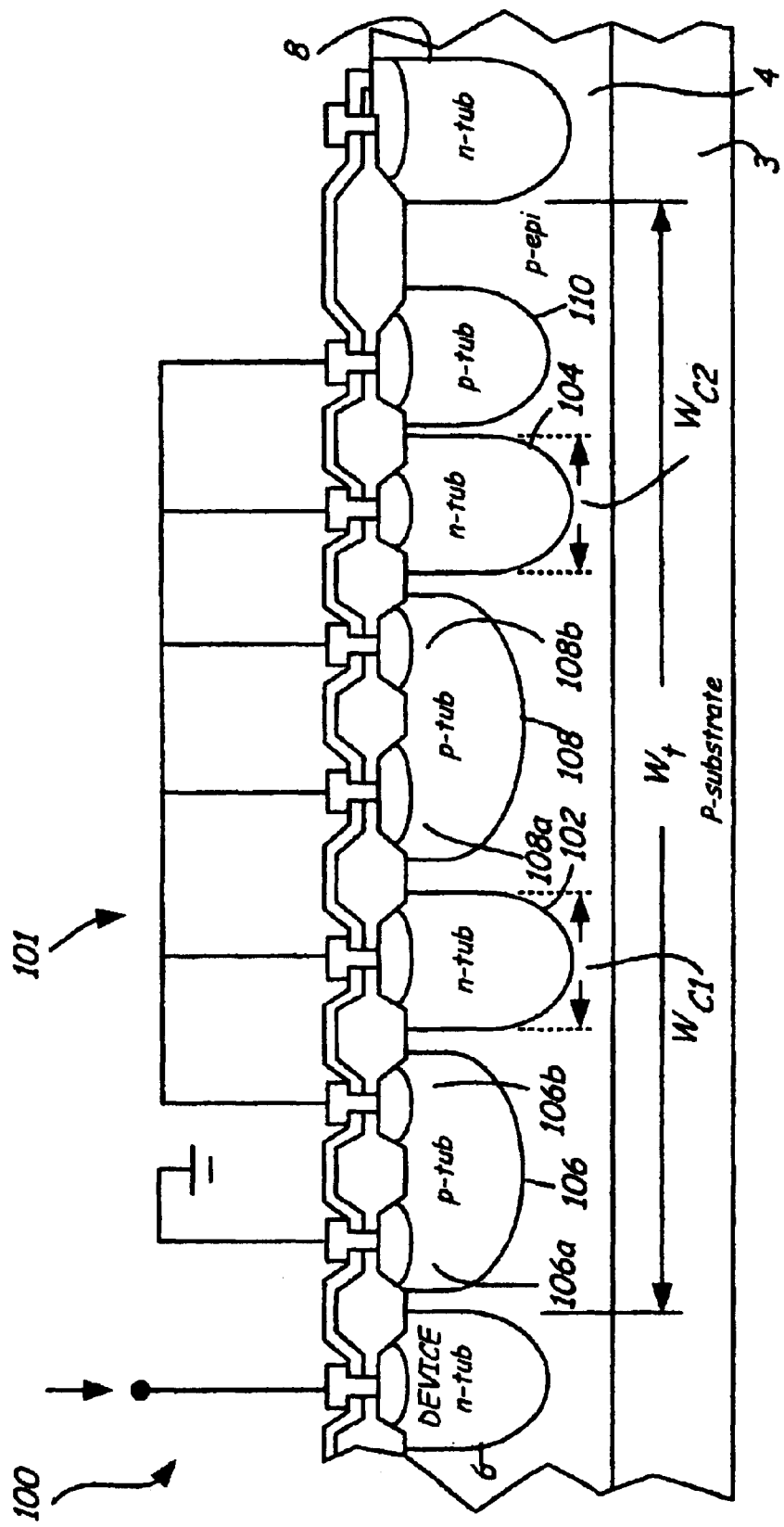
FIG. 10 shows an integrated circuit having a guard ring structure that has two central guard rings.

FIG. 10 shows integrated circuit 100 having unbiased guard ring structure 101 that has two laterally spaced central guard rings 102 and 104. The guard structure 101 also has flanking rings 106, 108 and 110. Central guard rings 102 and 104 are N-type rings, while flanking rings 106, 108 and 110 are P-type rings. Flanking ring 106 comprises rings 106a and 106b, similar to rings 12a and 12b contained in flanking ring 12 in FIG. 5A. Similarly, flanking ring 108 comprises rings 108a and 108b. Flanking ring 106a is grounded. Flanking rings 106b, 108a, 108b and 110 and central guard rings 102 and 104 are shorted together, and are unbiased. The overall width of guard ring 101 is denoted as Wt. The widths of central guard rings 102 and 104 are denoted as Wc1 and Wc2 respectively.

Figure 11:
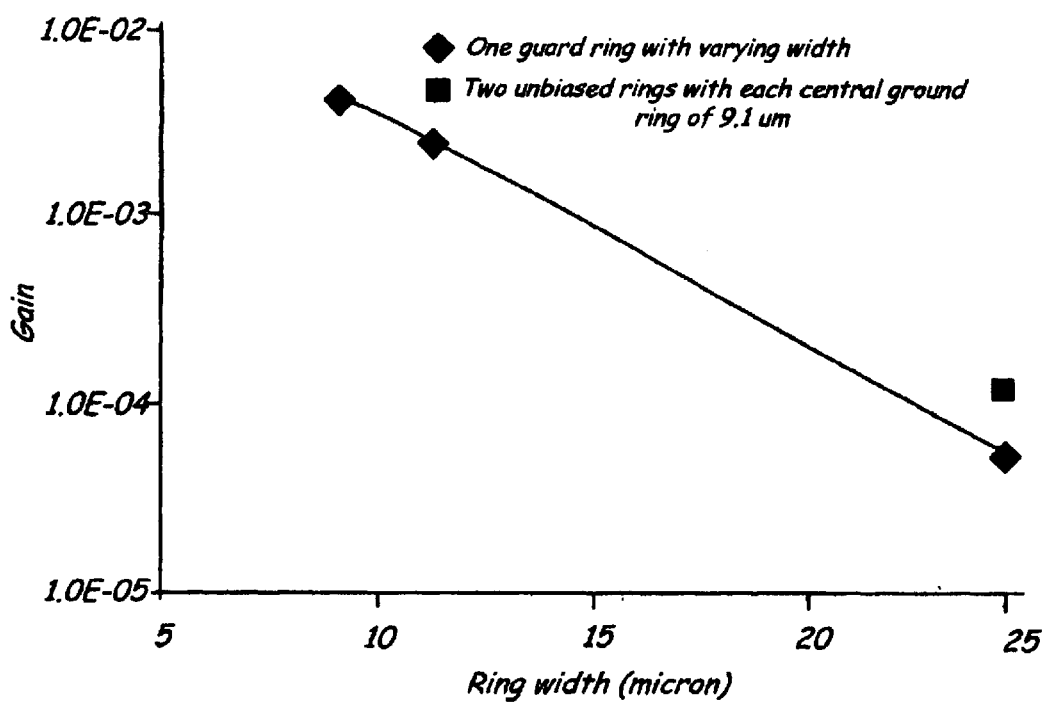
FIG. 11 is a graph showing the dependence of parasitic gain on the width of central guard ring in accordance with the present invention.

FIG. 11 is a graph showing the dependence of parasitic gain on the width of the central guard ring as measured in guard ring 91 (FIG. 9) and guard ring 101 (FIG. 10). Surprisingly, widening central guard ring 92 (FIG. 9) reduces the parasitic gain exponentially. As shown in FIG. 11, the parasitic gain is reduced twofold as width Wc of central guard ring 92 is changed from 9.1 $\mu$m to 11.3 $\mu$m. Increasing width Wc from 9.1 $\mu$m to 24.5 $\mu$m reduces the parasitic gain by nearly two additional orders of magnitude. As shown in FIG. 11, similar reduction of parasitic gain is demonstrated by guard ring 101 in FIG. 10. Specifically, guard ring 101 with two identical central guard rings 102 and 104 (Wc1=Wc2=9.1 $\mu$m) but the same overall width Wt as that of guard ring 91 in FIG. 9 also reduces the parasitic gain by nearly two additional orders of magnitude as compared to guard ring 91 with a single central guard ring having a width (Wc) of 9.1 $\mu$m. On the other hand, the transition current at which the high current effect occurs is not affected by width Wc of central guard ring 10 (FIG. 9) or the use of multiple central guard rings (102 and 104 in FIG. 10).

Figure 12:
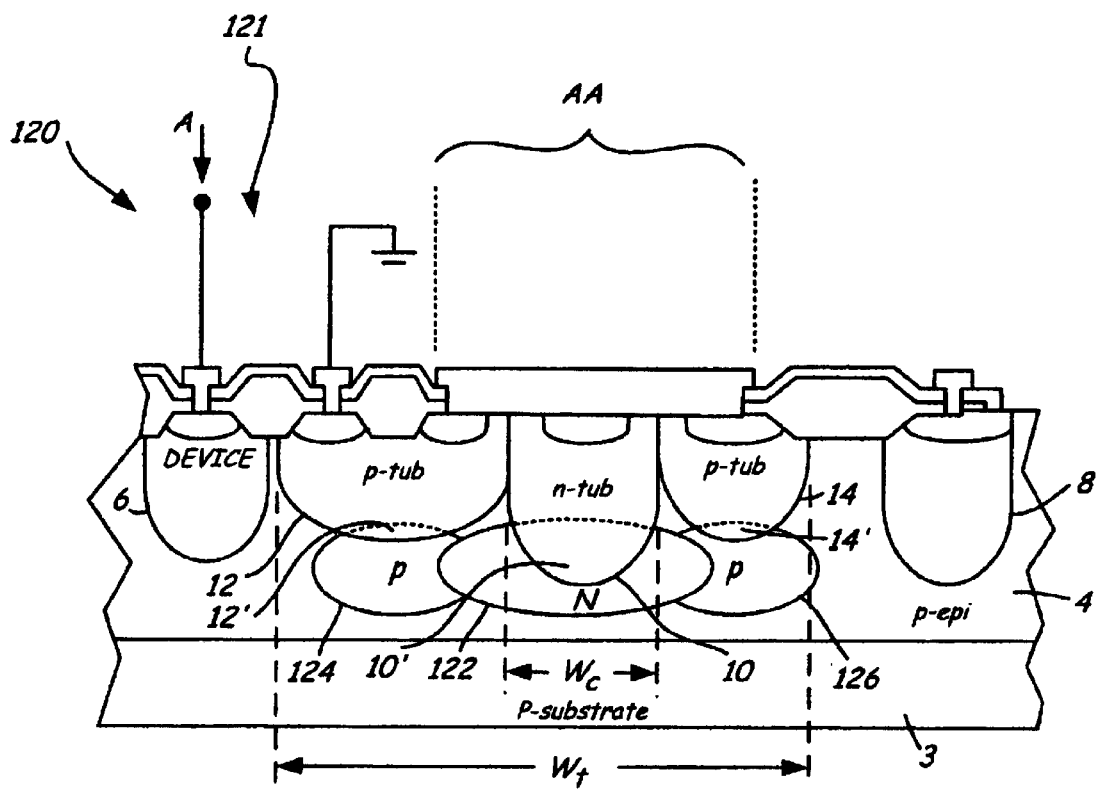
FIG. 12 shows an integrated circuit having a guard ring that uses an alternative way to increase the effective width of the central guard ring.

FIG. 12 shows integrated circuit 120 having guard ring 121 using an alternative way to increase the effective width of central guard ring 10. Buried layer 122 of the same conductivity type as central guard ring 10 is electrically connected to central guard ring 10 and laterally extends beyond central guard ring 10 to at least partially underlie flanking ring 12 and/or 14. Guard ring 121 reduces the parasitic gain by an amount greater than it would without buried layer 122, as if it had an effective central guard ring width that is greater than the actual width Wc of central guard ring 10. This design has an advantage of increasing the parasitic gain reduction without having to increase the actual overall width Wt of the guard ring 121.

Guard ring 121 further includes P-type buried layers 124 and 126 substantially underlying flanking rings 12 and 14, respectively, and in contact with the buried layer 122. Buried layers 122, 124 and 126 generally underlie the corresponding rings above (central guard ring 10, flanking rings 12 and 14 respectively) but may partially overlap with the corresponding rings above. The partial overlapping is indicated by overlapping portions 10', 12' and 14'. In addition, since buried layers 122, 124 and 126 each have the same conductivity type as that of their corresponding ring above, they may also function as conventional buried layer to prevent vertical breakthrough, making additional buried layers for such a purpose unnecessary.

The effects of increasing the width of a single central guard ring using multiple central guard rings are illustrated above in combination with using additional flanking ring(s) 12b (FIG. 9) or 106b and 108b (FIG. 10) to reduce the resistance between central guard ring(s) and the adjacent flanking rings. Such a particular combination, however, is not required. The width effect may be used in any other embodiments of the guard ring in accordance with the present invention, including the basic guard ring 2 in FIG. 1.

The present invention discloses a highly effective guard ring, particularly an unbiased guard ring, that can be used to isolate a variety of devices. An unbiased configuration of the guard ring in accordance with the present invention reduces the parasitic gain by nearly four orders of magnitude, while a configuration using additional means to reduce potential differences between central guard ring and flanking rings reduces the parasitic gain by two additional orders of magnitude. In particular, the guard ring in accordance with the present invention is a space-efficient way to introduce carrier recombination into a lateral bipolar junction transistor (BJT) device, thereby preventing the minority carriers from traveling far in the substrate. The guard ring structure is particularly useful for very large drive NMOS, in which the additional layout area required for the guard ring is negligible.

All measurements described herein are for an exemplary emitter area of 10.2×10.2 $\mu$m$^2$. Many large drivers used as emitters in practice are much larger than 10.2×10.2 $\mu$m$^2$. Since the parasitic gain decreases as the emitter area increases, the parasitic gain using a guard ring in accordance with the present invention in a practical circuit design is expected to be even lower than what has been described above.

Although the present invention has been described with reference to preferred embodiments, workers skilled in the art will recognize that changes may be made in form and detail without departing from the spirit and scope of the invention.

What is claimed is:

1. An integrated circuit, comprising:
   a semiconductor epitaxial layer of a first type conductivity on a semiconductor substrate;
   a semiconductor device in the epitaxial layer;
   a semiconductor central guard ring in the epitaxial layer and surrounding the semiconductor device, wherein the central guard ring is unbiased and has a second type conductivity opposite to the first type conductivity;
   a first flanking ring in the epitaxial layer between the semiconductor device and the central guard ring, wherein the first flanking ring has the first type conductivity and a lower resistivity than the epitaxial layer; and
   a second flanking ring in the epitaxial layer outside of the central guard ring, wherein the second flanking ring has the first type conductivity and a lower resistivity than the epitaxial layer.

2. The integrated circuit of claim 1, wherein both the central guard ring and the second flanking ring are unbiased.

3. The integrated circuit of claim 1, wherein the central guard ring and the second flanking ring are shorted together.

4. The integrated circuit of claim 1, wherein the first type conductivity is p type.

5. The integrated circuit of claim 1, wherein the semiconductor substrate has the first type conductivity.

6. The integrated circuit of claim 1, further comprising:
   a low resistance connection between the central guard ring and at least one of the first and second flanking rings to reduce resistance between the central guard ring and the first or second flanking rings.

7. The integrated circuit of claim 6, wherein the low resistance connection is an external metal connection.

8. The integrated that of claim 6, wherein the low resistance connection is an external layer of low resistivity covering at least a part of the central guard ring and at least a part of the first or second flanking rings.

9. The integrated that of claim 6, wherein the low resistance connection is a semiconductor connecting layer, the connecting layer underlying the central guard ring and extending to contact the first or second flanking rings.

10. The integrated circuit of claim 1, wherein the semiconductor device is a power device.

11. The integrated circuit of claim 1, further comprising:
a second semiconductor central guard ring formed in the epitaxial layer and surrounding the semiconductor device, wherein the second central guard ring disposed outside of the second flanking ring and has the second type conductivity.

12. The integrated circuit of claim 11, further comprising:
a third flanking ring formed in the epitaxial layer and disposed outside of the second central guard ring, wherein the third flanking ring has a lower resistivity than the epitaxial layer.

13. The integrated circuit of claim 1, further comprising:
a central buried layer substantially underlying the central guard ring and electrically connected thereto, the buried layer extending beyond the central guard ring to at least partially underlie the flanking ring or the second flanking ring.

14. An integrated circuit, comprising:
a semiconductor body layer;
a semiconductor device in the body layer;
a semiconductor central guard ring having a first type conductivity in the body layer surrounding the semiconductor device;
a first flanking ring in the body layer between the semiconductor device and the central guard ring, wherein the first flanking ring has a lower resistivity than the body layer and a second type conductivity opposite to the first type conductivity;
a second flanking ring in the body layer outside of the central guard ring, wherein the second flanking ring has a lower resistivity than the body layer a second type conductivity opposite to the first type conductivity;
means for reducing resistance across a region between the first and second flanking rings; and
wherein at least one of the central guard ring and the second flanking ring is unbiased.

15. The integrated circuit of claim 14, wherein both the central guard ring and the second flanking ring are unbiased.

16. The integrated circuit of claim 14, wherein the central guard ring and the second flanking ring are shorted together.

17. The integrated circuit of claim 14, wherein means for reducing resistance comprises a low resistance connection between the first and second flanking rings to reduce resistance therebetween.

18. The integrated circuit of claim 17, wherein the low resistance connection is an external metal connection.

19. The integrated that of claim 17, wherein the low resistance connection is an external layer of low resistivity covering at least a part of the first flanking ring and at least a part of the second flanking ring.

20. The integrated circuit of claim 17, wherein the low resistance connection is a semiconductor connecting layer of the first type conductivity, the connecting layer underlying the central guard ring and extending to contact the first and second flanking rings.

21. The integrated circuit of claim 14, wherein means for reducing resistance comprises a low resistance connection between the central guard ring and at least one of the first and second flanking rings to reduce resistance between the central guard ring and the first or second flanking rings.

22. The integrated circuit of claim 21, wherein the low resistance connection is an external metal connection.

23. The integrated that of claim 21, wherein the low resistance connection is an external layer of low resistivity covering at least a part of the central guard ring and at least a part of the first or second flanking rings.

24. The integrated circuit of claim 21, wherein the low resistance connection is a semiconductor connecting layer of the first type conductivity, the connecting layer underlying the central guard ring and extending to contact the first or second flanking rings.

25. The integrated circuit of claim 14, wherein the device is built in a tub of the first type conductivity.

26. The integrated circuit of claim 14, wherein the body layer has the second type conductivity.

27. The integrated circuit of claim 14, wherein the body layer comprises an epitaxial layer grown on a substrate.

28. The integrated circuit of claim 14, further comprising:
a central buried layer substantially underlying the central guard ring and electrically connected thereto, the central buried layer extending beyond the central guard ring to at least partially underlie the flanking ring or the second flanking ring.

29. The integrated circuit of claim 28, further comprising:
a first and second flanking buried layers substantially underlying the first and second flanking rings respectively and in contact with the central buried layer.

30. The integrated circuit of claim 28, wherein the central buried layer has the first type conductivity.

31. The integrated circuit of claim 28, wherein the central buried layer has the second type conductivity.

32. The integrated circuit of claim 28, further comprising:
a first and second flanking buried layers substantially underlying the first and second flanking rings respectively and in contact with the central buried layer.

33. An integrated circuit, comprising:
a semiconductor epitaxial layer of a first type conductivity on a semiconductor substrate;
a semiconductor device in the epitaxial layer;
a semiconductor central guard ring in the epitaxial layer and surrounding the semiconductor device, wherein the central guard ring has a second type conductivity opposite to the first type conductivity;
a first flanking ring in the epitaxial layer between the semiconductor device and the central guard ring, wherein the first flanking ring has the first type conductivity and a lower resistivity than the epitaxial layer;
a second flanking ring in the epitaxial layer outside of the central guard ring, wherein the second flanking ring has the first type conductivity and a lower resistivity than the epitaxial layer; and
a second semiconductor central guard ring formed in the epitaxial layer and surrounding the semiconductor device, wherein the second central guard ring disposed outside of the second flanking ring and has the second type conductivity.

34. The integrated circuit of claim 33, further comprising:
a third flanking ring formed in the epitaxial layer and disposed outside of the second central guard ring, wherein the third flanking ring has a lower resistivity than the epitaxial layer.

35. The integrated circuit of claim 33, wherein at least one of the first central guard ring, the second central guard ring and the second flanking ring is unbiased.

36. An integrated circuit, comprising:

a semiconductor body layer;

a semiconductor device in the body layer;

a semiconductor central guard ring having a first type conductivity in the body layer surrounding the semiconductor device;

a first flanking ring in the body layer between the semiconductor device and the central guard ring, wherein the first flanking ring has a lower resistivity than the body layer and a second type conductivity opposite to the first type conductivity;

a second flanking ring in the body layer outside of the central guard ring, wherein the second flanking ring has a lower resistivity than the body layer a second type conductivity opposite to the first type conductivity; and a semiconductor connecting layer of the first type conductivity for reducing resistance across a region between the first and second flanking rings, the connecting layer underlying the central guard ring and extending to contact the first and second flanking rings.

* * * * *

UNITED STATES PATENT AND TRADEMARK OFFICE
CERTIFICATE OF CORRECTION

PATENT NO. : 6,747,294 B1
DATED : June 8, 2004
INVENTOR(S) : Sandhya Gupta et al.

It is certified that error appears in the above-identified patent and that said Letters Patent is hereby corrected as shown below:

Title page,
Item [56], References Cited, OTHER PUBLICATIONS,
delete "Chen et al.", insert -- Chan et al. --

Column 2,
Line 18, delete "necessary in", insert -- necessary. In --

Column 10,
Line 18, delete "FIG.", insert -- FIG. 5A --

Signed and Sealed this

Eighteenth Day of January, 2005

JON W. DUDAS
*Director of the United States Patent and Trademark Office*